(12) United States Patent
Chang et al.

(10) Patent No.: US 10,818,644 B2
(45) Date of Patent: Oct. 27, 2020

(54) DISPLAY DEVICE

(71) Applicant: HARVATEK CORPORATION, Hsinchu (TW)

(72) Inventors: Jen-Hung Chang, Hsinchu (TW); Song-Yi Hsiao, Hsinchu (TW)

(73) Assignee: HARVATEK CORPORATION, Hsinchu (TW)

( * ) Notice: Subject to any disclaimer, the term of this patent is extended or adjusted under 35 U.S.C. 154(b) by 0 days.

(21) Appl. No.: 16/822,834

(22) Filed: Mar. 18, 2020

(65) Prior Publication Data

US 2020/0219856 A1    Jul. 9, 2020

Related U.S. Application Data

(63) Continuation-in-part of application No. 15/867,005, filed on Jan. 10, 2018, now abandoned.

(30) Foreign Application Priority Data

Sep. 22, 2017 (TW) ............................ 106132553 A

(51) Int. Cl.
| | |
|---|---|
| H01L 25/075 | (2006.01) |
| H01L 33/62 | (2010.01) |
| H01L 33/52 | (2010.01) |
| G09F 9/33 | (2006.01) |

(52) U.S. Cl.
CPC .......... *H01L 25/0753* (2013.01); *H01L 33/52* (2013.01); *H01L 33/62* (2013.01); *G09F 9/33* (2013.01)

(58) Field of Classification Search
CPC ....... G09F 9/33; H01L 33/62; H01L 25/0753; H01L 33/52; H01L 27/3211; H01L 27/3246; H01L 51/5237
See application file for complete search history.

(56) References Cited

U.S. PATENT DOCUMENTS

| | | | |
|---|---|---|---|
| 2010/0163892 A1* | 7/2010 | Liu | F21V 31/04 257/89 |
| 2014/0353694 A1* | 12/2014 | Pang | H01L 24/97 257/89 |
| 2017/0323592 A1* | 11/2017 | Hughes | H01L 25/0753 |

FOREIGN PATENT DOCUMENTS

| | | |
|---|---|---|
| TW | 201638911 A | 11/2016 |

OTHER PUBLICATIONS

Search Report appended to an Office Action issued to Taiwanese counterpart application No. 106132553 by the TIPO dated Oct. 26, 2018, with an English translation thereof.

\* cited by examiner

*Primary Examiner* — Abhishek Sarma

(57) ABSTRACT

A display device includes multiple packages, each including a substrate, multiple pixel members, and an encapsulant. Each of the pixel members includes a first light emitting diode (LED) chip, a second LED chip, and a third LED chip. The LED chips of one of the two adjacent pixel members are arranged along a first direction, and the LED chips of the other one of the two adjacent pixel members are arranged along a second direction orthogonal to the first direction. Each of the packages has a first spacing between the first LED chips of the two adjacent pixel members. The first LED chip of each pixel member in each package is spaced apart from a nearest one of the first LED chips of the nearest package by a second spacing equal to the first spacing.

10 Claims, 5 Drawing Sheets

DISPLAY DEVICE

CROSS-REFERENCE TO RELATED APPLICATION

This application is a continuation-in-part application of U.S. patent application Ser. No. 15/867,005 filed on Jan. 10, 2018, which claims priority of Taiwanese Invention Patent Application No. 106132553, filed on Sep. 22, 2017. The entire content of each of the U.S. and Taiwanese patent applications is incorporated herein by reference.

FIELD

This disclosure relates to a display device, and more particularly to a display device including a plurality of packages that includes a plurality of pixel members.

BACKGROUND

A conventional display device (e.g., a light emitting diode (LED) display device) mainly includes a plurality of chip packages disposed on a circuit board. Each of the chip packages includes a single encapsulated pixel member that has a red LED chip, a green LED chip, and a blue LED chip.

In light of the trend towards enhancing display quality of the conventional display device, an increase in the density of the chip packages per unit area of the circuit board and a decrease in the size of the chip packages are pursued. However, with the decrease in the size of the chip packages, circuit that is formed on the circuit board and external electrodes that are connected between the circuit board and each of the chip packages are required to be arranged in a relatively dense manner. Each of the chip packages generally includes four of the external electrodes that are electrically connected to the three LED chips for transmission of electricity. In other words, the conventional display device has a number of the external electrodes of the conventional packages that equals to four times of a number of the conventional chip packages. For example, when the conventional display device has four conventional packages, the conventional display device would have sixteen external electrodes. Besides, except for the chip packages, other electronic components, such as integrated circuit (IC) driving component, and passive components, such as capacitors or resistors, are also disposed on the circuit board. Hence, the conventional display device having such a compact arrangement is relatively difficult to manufacture, leading to an increase in production cost.

Besides, with the increase in the density of the chip packages disposed on the circuit board, the length and width of each of the chip packages are required to be reduced, while the height of each of the chip packages remains unchanged. Hence, the chip packages will have an increased aspect ratio, which causes mounting of the chip packages on the circuit board to have insufficient stability. Hence, when the conventional display device is assembled or shipped, the chip packages would easily fall out of the circuit board due to collisions. Therefore, the maintenance and repair cost of the conventional display device would be unavoidably increased.

In addition, for improving the display quality of the conventional display device, the LED chips included in the pixel members of the chip packages are preferred to be equidistantly arranged. With the decrease in the size of the chip packages, arranging the LED chips of the pixel members of the chip packages in an equidistant manner is becoming increasingly difficult.

SUMMARY

Therefore, an object of this disclosure is to provide a display device that can alleviate at least one of the drawbacks of the prior art.

According to this disclosure, the display device includes a plurality of packages arranged in an array. Each of the packages includes a substrate, a plurality of pixel members, and an encapsulant. The substrate includes a first surface and a second surface opposite to the first surface. The pixel members are mounted on the first surface of the substrate and are arranged in an array. The encapsulant covers the pixel members and the first surface of the substrate. Each of the pixel members includes a first light emitting diode (LED) chip, a second LED chip, and a third LED chip. The first LED chip is positioned between the second LED chip and the third LED chip. The first, second and third LED chips of one of two adjacent ones of the pixel members are arranged along a first direction, and the first, second and third LED chips of the other one of the two adjacent ones of the pixel members are arranged along a second direction. The first direction and the second direction are orthogonal to each other. Each of the packages has a first spacing between the first LED chips of the two adjacent ones of the pixel members. The first LED chip of each of the pixel members in each of the packages is spaced apart from a nearest one of the first LED chip of a nearest one of the packages by a second spacing. The first spacing is equal to the second spacing.

BRIEF DESCRIPTION OF THE DRAWINGS

Other features and advantages of this disclosure will become apparent in the following detailed description of the embodiment with reference to the accompanying drawings, of which.

DETAILED DESCRIPTION

Figure 1:
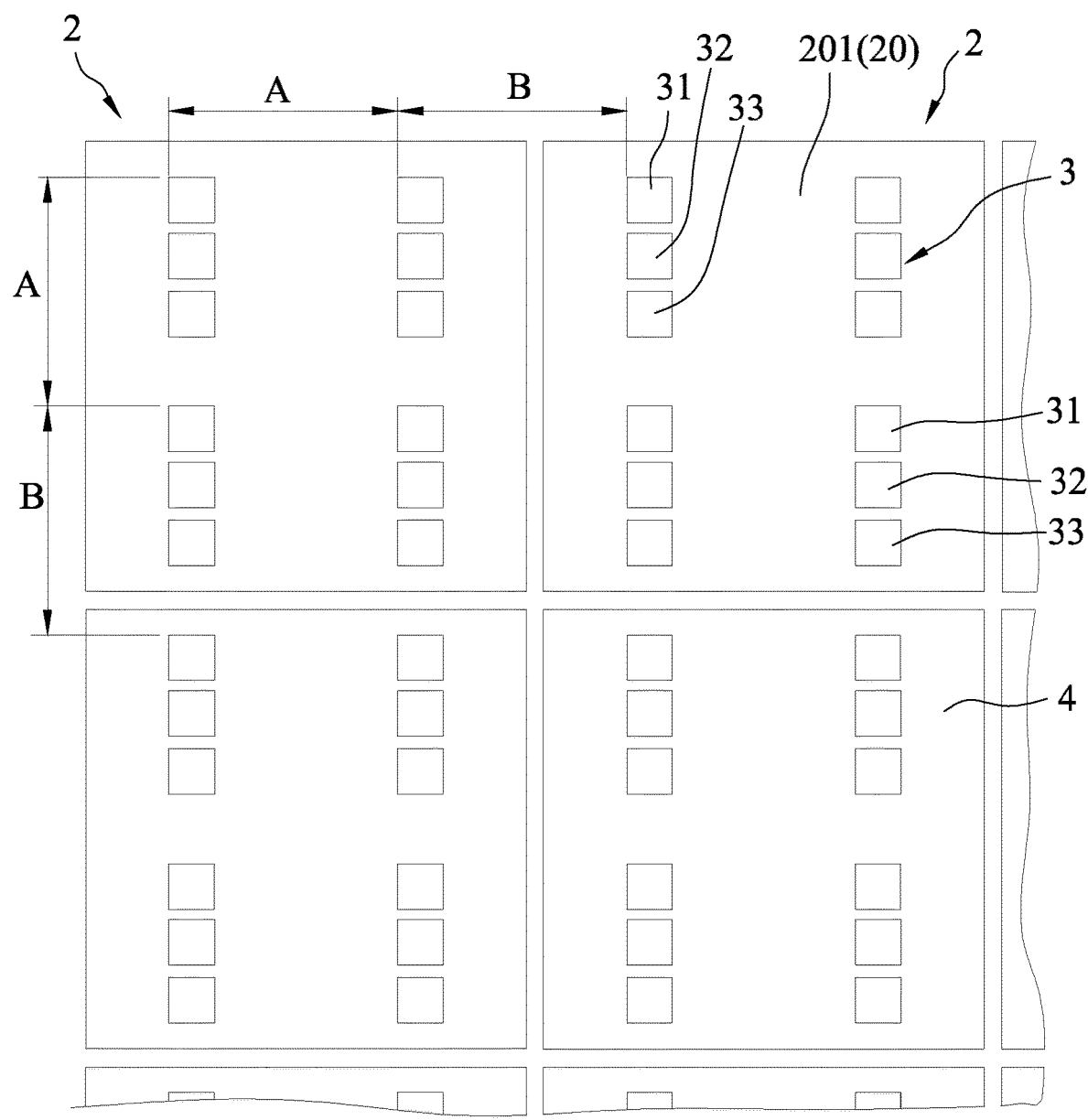
FIG. 1 is a fragmentary schematic top view illustrating a first embodiment of the display device according to this disclosure.

Before this disclosure is described in greater detail, it should be noted that where considered appropriate, reference numerals or terminal portions of reference numerals have been repeated among the figures to indicate corresponding or analogous elements, which may optionally have similar characteristics.

Figure 2:
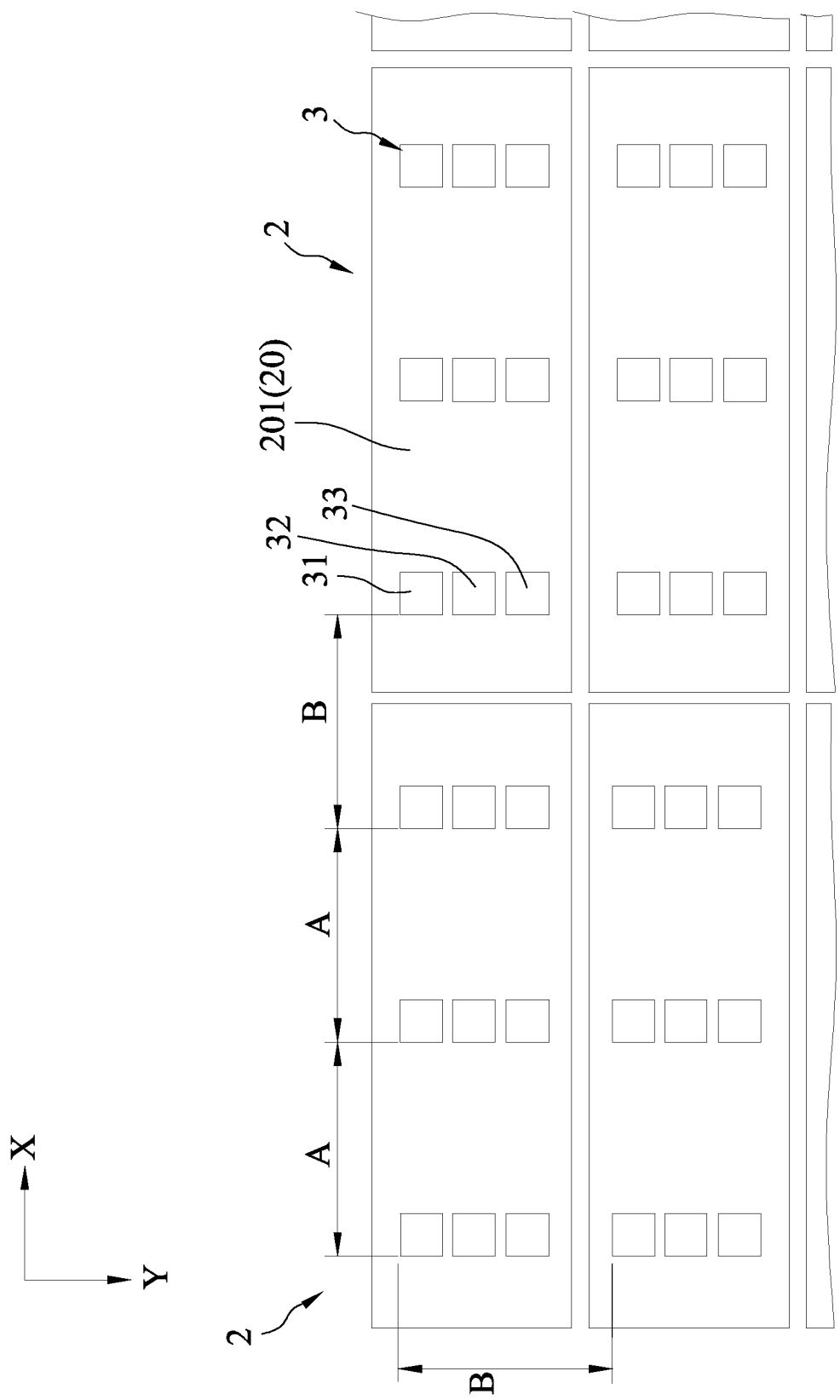
FIG. 2 is a fragmentary schematic top view illustrating another configuration of the first embodiment.
Figure 3:
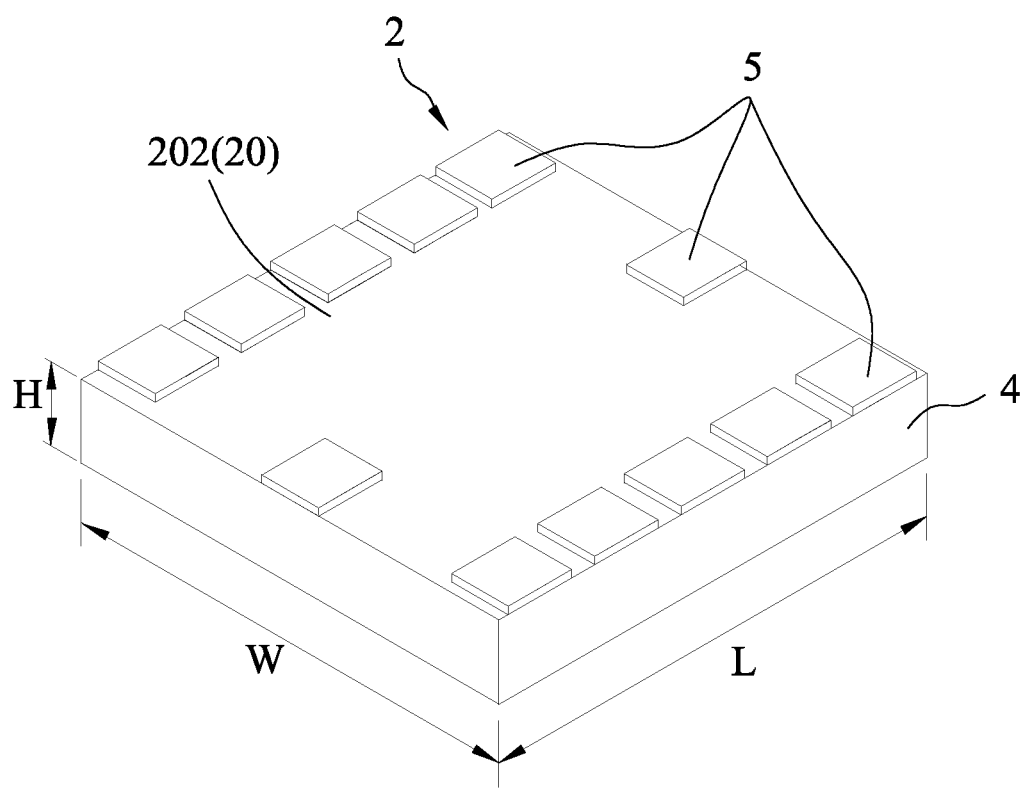
FIG. 3 is a perspective view illustrating a plurality of external electrodes disposed on a substrate of the first embodiment.

Referring to FIGS. 1 to 3, a first embodiment of a display device according to this disclosure includes a plurality of packages 2 arranged in an array and disposed on a circuit board (not shown). Each of the packages 2 includes a substrate 20 having a first surface 201 and a second surface 202 opposite to the first surface 201, a plurality of pixel members 3 mounted on the first surface 201 of the substrate 20, and an encapsulant 4 covering the pixel members 3 and the first surface 201 of the substrate 20. In this embodiment, each of the packages 2 includes four pixel members 3 encapsulated together by the encapsulant 4. More specifically, the encapsulant 4 may be made of a transparent polymeric material or other materials suitable for encapsulating a light emitting (LED) chip. It is noted that selection of the material for making the encapsulant 4 is well known to those skilled in the art, and further details thereof are not provided herein for the sake of brevity.

Each of the pixel members 3 includes a first LED chip 31, a second LED chip 32, and a third LED chip 33. In the first embodiment, the first LED chip 31 is a red LED chip that emits a first light having a wavelength ranging from 605 nm to 645 nm, the second LED chip 32 is a green LED chip that emits a second light having a wavelength ranging from 510 nm to 545 nm, and the third LED chip 33 is a blue LED chip that emits a third light having a wavelength ranging from 450 nm to 485 nm, such that each of the pixel members 3 includes RGB LED chips of three primary colors.

The pixel members 3 of each of the packages 2 are arranged in an array, such as a one-dimensional or two-dimensional array and are not limited to be arranged in a particular array. In a variation of this embodiment, the pixel members 3 of each of the packages 2 are arranged in a $2^n \times 2^m$ array that has $2^n$ rows and $2^m$ columns, where n and m are respectively a natural number ranging from 1 to 3. Referring back to FIG. 1, the pixel members 3 of each of the packages 2 are exemplified to be arranged in the two-dimensional 2×2 array. Alternatively, the pixel members 3 of each of the packages 2 may be arranged in a 1×(k+1) array that has one row and (k+1) of the pixel members 3 (i.e. (k+1) represents the number of the pixel members 3 in such one row), where k is a natural number excluding 0, and preferably k is 1 to 4. For instance, the pixel members 3 of each package 2 may be arranged in 1×2, 1×3, 1×4, or 1×5 array, etc. Referring back to FIG. 2, the pixel members 3 of each of the packages 2 are exemplified to be arranged in the one-dimensional 1×3 array. Furthermore, when the packages 2 are arranged in an array to form the display device, the display device may have a display solution to be one of stand definition (SD), high definition (HD), full high definition (full HD), and 4K resolution. To be specific, the pixel members 3 of the packages 2 of the display device may be arranged in a matrix array selected from one of 720×480, 1280×720, 1920×1080, 3840×2160, and 4096×2160. The display device of the 720×480 matrix array has SD resolution. The display device of the 1280×720 matrix array has HD resolution. The display device of the 1920×1080 matrix array has full HD resolution. The display device of the 3840×2160 matrix array or the 4096×2160 matrix array has 4K resolution.

Referring back to FIGS. 1 and 2, each of the packages 2 has a first spacing (A) between the first LED chips 31 of two adjacent ones of the pixel members 3. The first LED chip 31 of each of the pixel members 3 in each of the packages 2 is spaced apart from a nearest one of the first LED chip 31 of a nearest one of the packages 2 by a second spacing (B). The first spacing (A) is equal to the second spacing (B). In this embodiment, the first spacing (A) and the second spacing (B) range from 0.5 mm to 1.25 mm.

By way of encapsulating a plurality of the pixel members 3 with the encapsulant 4 to form each of the packages 2, top and bottom surfaces of each of the packages 2 have an increased area, and thus, the aspect ratio of each of the packages 2 is reduced. Furthermore, by way of increasing the area of the top and bottom surfaces of each of the packages 2, the area size of external electrodes 5 (e.g., solder pads) can be enlarged without reducing gaps thereamong. Thus, adhesion of the packages 2 to a circuit board (not shown) is enhanced to improve the stability in mounting the whole display device on the circuit board. Therefore, falling of the packages 2 from the circuit board during shipment and assembling of the display device including the packages 2 can be avoided or at least alleviated. In addition, since the first spacing (A) of the packages 2 is equal to the second spacing (B), the lights emitting from the first, second and third LED chips 31, 32, 33 of the packages 2 are well-mixed, and thus color distortion of an image displayed by the display device can be avoided or at least alleviated.

More specifically, since the circuit in each of the packages 2 may be integrated in or formed on the substrate 20, each of the packages 2 further includes a plurality of the external electrodes 5 that are mounted on the second surface 202 of the substrate 20, which serves as the bottom surface of each the package with a relatively less density. The external electrodes 5 are electrically connected to the pixel members 3. Each of the packages 2 has a number of the external electrodes 5 less than four times of a number of the pixel members 3. In this embodiment, each of the packages 2 includes four pixel members 3, and the number of the external electrodes 5 is twelve, which is less than sixteen required by the conventional chip package, so that the density of the external electrodes 5 required to be connected to the circuit board for the packages 2 of the display device of this disclosure is less than that of the chip packages of the conventional display device. In a variation of this embodiment, the first, second and third LED chips 31, 32, 33 of the pixel members 3 of each of the packages 2 may be electrically connected together to a ground electrode through the circuit integrated in or formed on the substrate 20.

Figure 4:
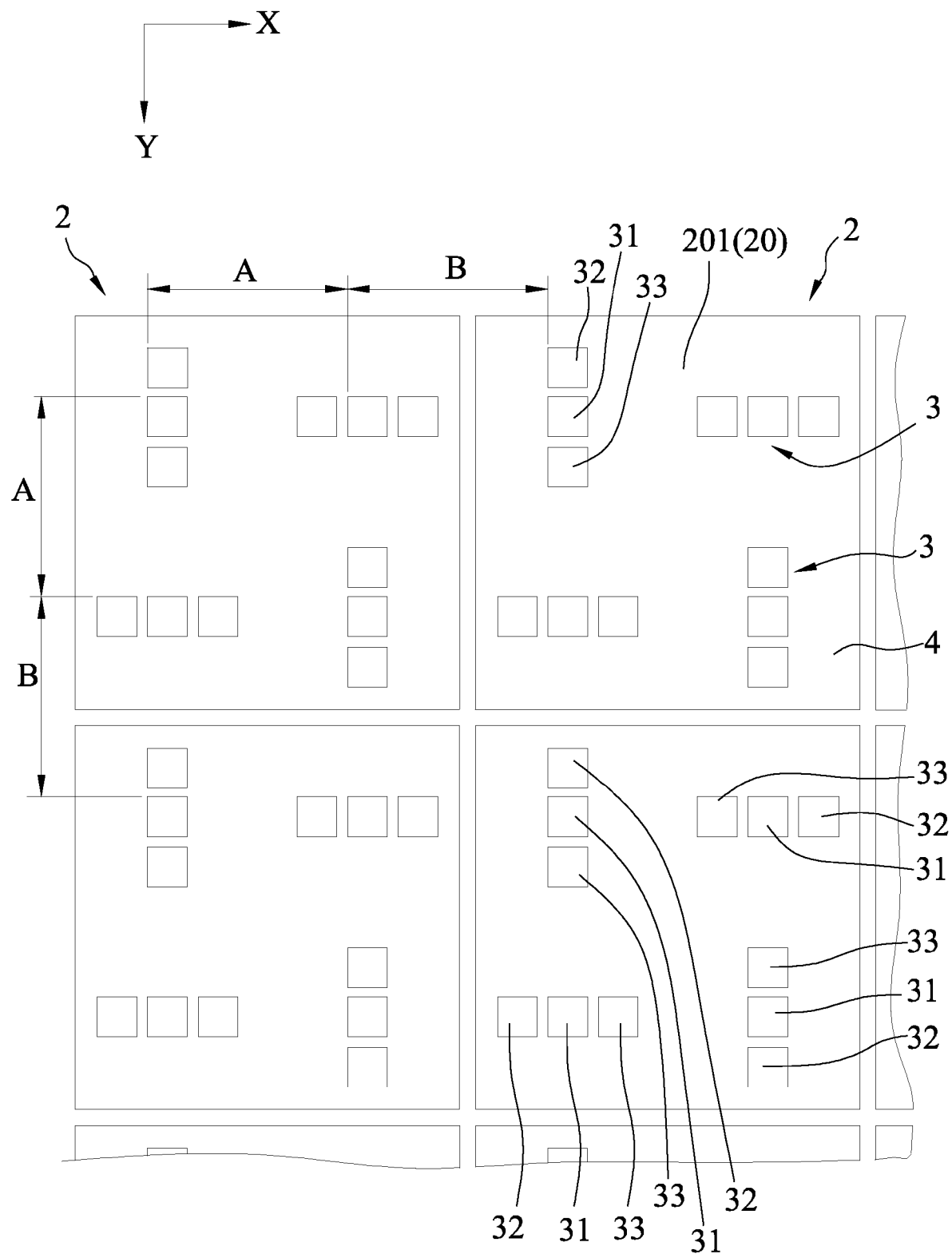
FIG. 4 is a fragmentary schematic top view illustrating a second embodiment of the display device according to this disclosure.

Referring to FIG. 4, a second embodiment of the display device according to this disclosure is substantially similar to the first embodiment except that in the second embodiment, the arrangement of the first, second and third LED chips 31, 32, 33 of two adjacent ones of the pixel members 3 in each of the packages 2 is different from that of the first embodiment. In addition, in the second embodiment, the first LED chip 31 is a green LED chip that emits a first light having a wavelength ranging from 510 nm to 545 nm, the second LED chip 32 is a blue LED chip that emits a second light having a wavelength ranging from 450 nm to 485 nm, and the third LED chip 33 is a red LED chip that emits a third light having a wavelength ranging from 605 nm to 645 nm.

To be specific, in each of the pixel members 3 of the second embodiment, the first LED chip 31 is positioned between the second LED chip 32 and the third LED chip 33. The first, second and third LED chips 31,32, 33 of one of two adjacent ones of the pixel members 3 are arranged along a first direction (X), and the first, second and third LED chips 31, 32, 33 of the other one of the two adjacent ones of the pixel members 3 are arranged along a second direction (Y). The first direction (X) and the second direction (Y) are orthogonal to each other.

As shown in FIG. 4, the pixel members 3 of each of the packages 2 are exemplified to be arranged in the two-dimensional 2×2 array, i.e., a top-right pixel member 3, a top-left pixel member 3, a bottom-right pixel member 3, and a bottom-left pixel member 3 are provided in each of the packages 2. In each of the packages 2, the first, second and third LED chips 31, 32, 33 of each of the top-right pixel member 3 and the bottom-left pixel member 3 are arranged along the first direction (X). The first, second and third LED chips 31, 32, 33 of each of the top-left pixel member 3 and the bottom-right pixel member 3 are arranged along the second direction (Y).

In one form, as shown in FIG. 4, in each of the packages 2, the third LED chip 33 of one the pixel members 3 arranged in the first direction (X) (e.g., the third LED chip 33 of the top-right pixel member 3) is positioned closer to a nearest one of the first LED chips 31 arranged in the second direction (Y) (i.e., the first LED chip 31 of the top-left pixel member 3) than the second LED chip 32 of the same one of the pixel members 3 arranged in the first direction (X) (i.e., the second LED chip 32 of the top-right pixel member 3). Moreover, the third LED chip 33 of one of the pixel members 3 arranged in the second direction (Y) (e.g., the third LED chip 33 of the top-left pixel member 3) is positioned closer to a nearest one of the first LED chips 31 arranged in the first direction (X) (i.e., the first LED chip 31 of the bottom-left pixel member 3) than the second LED chip 32 of the same one of the pixel members 3 arranged in the second direction (Y) (i.e., the second LED chip 32 of the top-left pixel member 3). Furthermore, the third LED chip 33 of the one of the pixel members 3 arranged in the first direction (X) (e.g., the third LED chip 33 of the top-right pixel member 3), when imaginarily projected along the first direction (X) on the nearest one of the first LED chips 31 arranged in the second direction (Y) (i.e., the first LED chip 31 of the top-left pixel member 3), aligns with the same (i.e., the first LED chip 31 of the top-left pixel member 3). The third LED chip 33 of the one of the pixel members 3 arranged in the second direction (Y) (e.g., the third LED chip 33 of the top-left pixel member 3), when imaginarily projected along the second direction (Y) on the nearest one of the first LED chips 31 arranged in the first direction (X) (i.e., the first LED chip 31 of the bottom-left pixel member 3), aligns with the same (i.e., the first LED chip 31 of the bottom-left pixel member 3).

Figure 5:
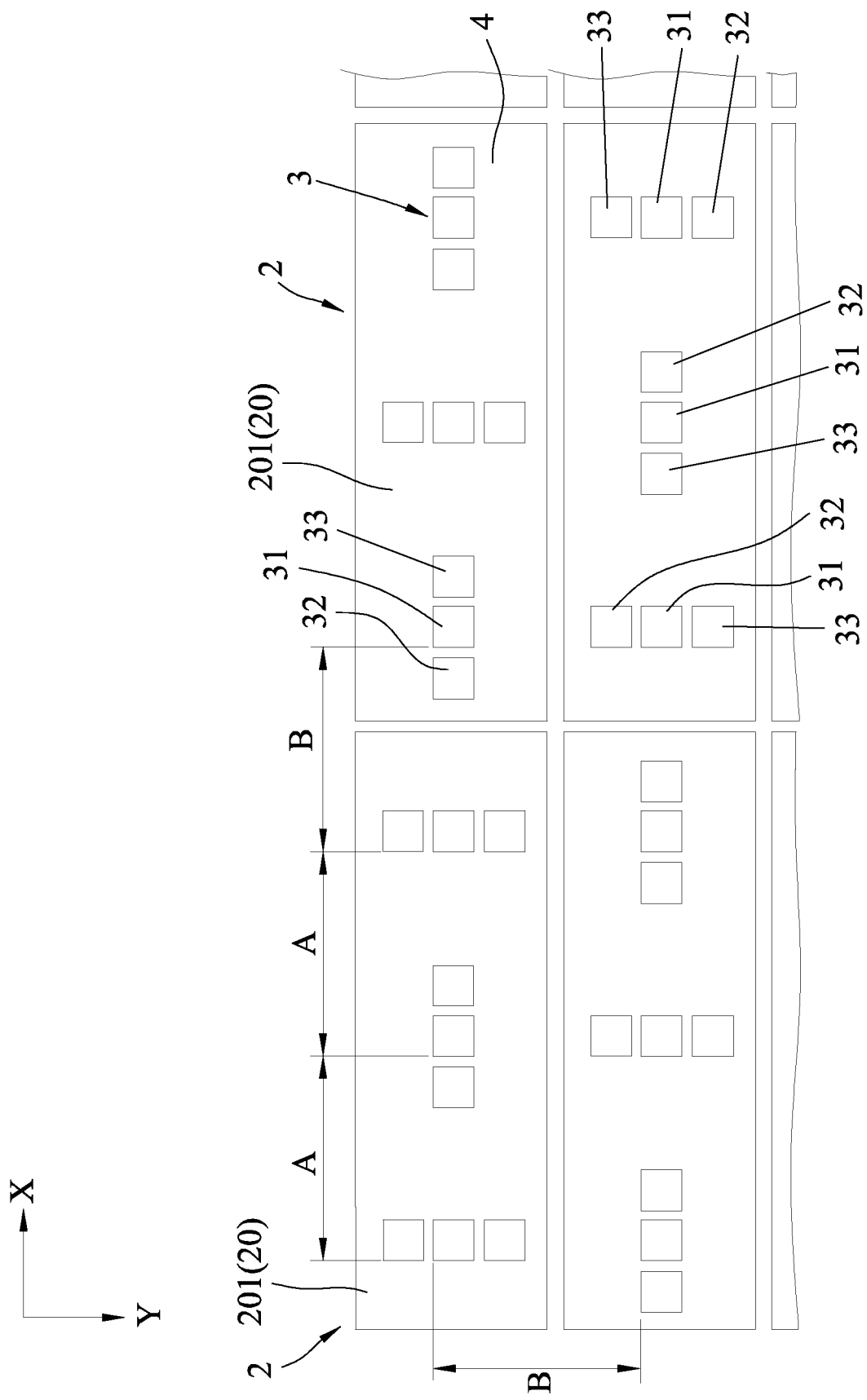
FIG. 5 is a fragmentary schematic top view illustrating another configuration of the second embodiment.

Referring to FIG. 5, in a variation of the second embodiment, the pixel members 3 of each of the packages 2 is arranged in a 1×(k+1) array that has one row and (k+1) of the pixel members 3 (i.e. (k+1) represents the number of the pixel members 3 in such one row), where k is a natural number excluding 0, and preferably k is 1 to 4. For instance, the pixel members 3 of each package 2 may be arranged in 1×2, 1×3, 1×4, or 1×5 array, etc. Each of the pixel members 3 in each of the packages 2 is arranged in a direction different from that of a nearest one of the pixel members 3 of a nearest one of the packages 2.

It should be noted in the first embodiment, in which each of the pixel members 3 including RGB LED chips 31, 32, 33 of three primary colors in each of the packages 2 is arranged in a vertical direction as shown in FIG. 1, when a user views the display device from above and from below, the user may find that the color of display device appears reddish and bluish, respectively. Likewise, if the display device is rotated 90 degrees to permit each of the pixel members 3 including RGB LED chips 31, 32, 33 of three primary colors in each of the packages 2 to be arranged in a horizontal direction, chromatic aberration of the display device may occur when the user views the display device from different viewing angles, resulting in similar display content having a great color difference (i.e., chromatic aberration). In comparison to the first embodiment, the arrangement of the first, second and third LED chips 31, 32, 33 of the pixel members 3 in each of the packages 2 of the second embodiment of the display device of this disclosure as mentioned above can greatly reduce chromatic aberration which may occur in the first embodiment of the display device.

In summary, by arranging the first, second and third LED chips 31,32, 33 of one of two adjacent ones of the pixel members 3 along the first direction (X), and the first, second and third LED chips 31, 32, 33 of the other one of the two adjacent ones of the pixel members 3 along the second direction (Y) that is orthogonal to the first direction, chromatic aberration of the display device of this disclosure can be avoided when viewed by a user from different angles. In addition, by having the third LED chip 33 of the one of the pixel members 3 arranged in the first direction (X), due to the aforesaid alignment of such third LED chip 33 with the nearest one of the first LED chips 31 arranged in the second direction (Y) upon imaginary projection, hot spot phenomenon of the display device of this disclosure can be greatly reduced. Moreover, by virtue of the design of each of the packages 2 including the multiple pixel members 3, the resolution of the display device of this disclosure can be greatly enhanced. Besides, since the first spacing (A) of each of the packages 2 is equal to the second spacing (B), the lights emitting from the first, second and third LED chips 31, 32, 33 can be well-mixed, and the quality of the image displayed by the display device of this disclosure can be improved. Furthermore, with the reduction of the aspect ratio and the increase in the number of the external electrodes 5 without increasing the density thereof, the stability in mounting of the packages 2 in the subsequent step, such as disposing of the packages 2 on the circuit board, can be enhanced.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of this disclosure. It should be further appreciated that in the description, various features are sometimes grouped together in a single embodiment, figure, or description thereof for the purpose of streamlining this disclosure and aiding in the understanding of various inventive aspects.

While this disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A display device, comprising:
a plurality of packages arranged in an array, each of said packages including:
a substrate including a first surface and a second surface opposite to said first surface;
a plurality of pixel members mounted on said first surface of said substrate and arranged in an array, each of said pixel members including a first light emitting diode (LED) chip, a second LED chip, and a third LED chip, said first LED chip being positioned between said second LED chip and said third LED chip; and
an encapsulant covering said pixel members and said first surface of said substrate,
wherein said first, second and third LED chips of one of two adjacent ones of said pixel members are arranged along a first direction, and said first, second and third LED chips of the other one of said two adjacent ones of said pixel members are arranged along a second direction, the first direction and the second direction being orthogonal to each other;

wherein each of said packages has a first spacing between said first LED chips of said two adjacent ones of said pixel members; and wherein said first LED chip of each of said pixel members in each of said packages is spaced apart from a nearest one of said first LED chips of a nearest one of said packages by a second spacing, the second spacing being equal to the first spacing.

2. The display device of claim 1, wherein, in each of said packages, said third LED chip of one of said pixel members arranged in the first direction is positioned closer to a nearest one of said first LED chips arranged in the second direction than said second LED chip of said same one of said pixel members arranged in the first direction, and said third LED chip of one of said pixel members arranged in the second direction is positioned closer to a nearest one of said first LED chips arranged in the first direction than said second LED chip of said same one of said pixel members arranged in the second direction.

3. The display device of claim 2, wherein, in each of said packages, said third LED chip of said one of said pixel members arranged in the first direction, when imaginarily projected along the first direction on said nearest one of said first LED chips arranged in the second direction, aligns with the same, and said third LED chip of said one of said pixel members arranged in the second direction, when imaginarily projected along the second direction on said nearest one of said first LED chips arranged in the first direction, aligns with the same.

4. The display device of claim 3, wherein in each of said pixel members, said first LED chip emits a first light having a wavelength ranging from 510 nm to 545 nm, said second LED chip emits a second light having a wavelength ranging from 450 nm to 485 nm, and said third LED chip emits a third light having a wavelength ranging from 605 nm and 645 nm.

5. The display device of claim 1, wherein each of said packages further includes a plurality of external electrodes that are mounted on a second surface of said substrate and that are electrically connected to said pixel members, each of said packages having a number of said external electrodes less than four times of a number of said pixel members.

6. The display device of claim 1, wherein said pixel members of each of said packages are arranged in a $2^n \times 2^m$ array that has $2^n$ rows and $2^n$ columns, n and m being a natural number and ranging from 1 to 3.

7. The display device of claim 1, wherein said pixel members of each of said packages are arranged in a $1 \times (k+1)$ array that has one row and (k+1) of said pixel members, k being a natural number and ranging from 1 to 4, each of said pixel members in each of said packages being arranged in a direction different from that of a nearest one of said pixel members of a nearest one of said packages.

8. The display device of claim 7, wherein each of said pixel members in each of said packages is arranged in a direction different from that of a nearest one of said pixel members of a nearest one of said packages.

9. The display device of claim 1, wherein said first spacing and said second spacing range from 0.5 mm to 1.25 mm.

10. The display device of claim 1, wherein said pixel members of said packages are arranged in a matrix array selected from one of 720×480, 1280×720, 1920×1080, 3840×2160, and 4096×2160.

\* \* \* \* \*